(12) United States Patent
Allen et al.

(10) Patent No.: US 7,240,306 B2
(45) Date of Patent: Jul. 3, 2007

(54) INTEGRATED CIRCUIT LAYOUT CRITICAL AREA DETERMINATION USING VORONOI DIAGRAMS AND SHAPE BIASING

(75) Inventors: Robert J. Allen, Jericho, VT (US); Peter K. Chan, Union City, CA (US); Evanthia Papadopoulou, New York, NY (US); Sarah C. Prue, Richmond, VT (US); Mervyn Y. Tan, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 10/906,553

(22) Filed: Feb. 24, 2005

(65) Prior Publication Data

US 2006/0190224 A1 Aug. 24, 2006

(51) Int. Cl.
*G06F 17/50* (2006.01)
*G06F 19/00* (2006.01)
*G06F 17/10* (2006.01)
*G06F 11/00* (2006.01)
*G06K 9/03* (2006.01)
*G06K 9/52* (2006.01)

(52) U.S. Cl. .................. 716/4; 700/110; 382/149; 382/154; 714/25

(58) Field of Classification Search .............. 716/4; 700/110; 382/149, 154; 714/25
See application file for complete search history.

(56) References Cited

U.S. PATENT DOCUMENTS

| 6,044,208 | A | 3/2000 | Papadopoulou et al. |
| 6,178,539 | B1 | 1/2001 | Papadopoulou et al. |
| 6,247,853 | B1 | 6/2001 | Papadopoulou et al. |
| 6,317,859 | B1 | 11/2001 | Papadopoulou |
| 6,876,445 | B2* | 4/2005 | Shibuya et al. .......... 356/237.2 |
| 6,948,141 | B1* | 9/2005 | Satya et al. ................... 716/4 |
| 2002/0181756 | A1* | 12/2002 | Shibuya et al. ............. 382/145 |
| 2004/0064269 | A1* | 4/2004 | Shibuya et al. ............... 702/40 |
| 2004/0096092 | A1* | 5/2004 | Ikeda ........................ 382/141 |
| 2005/0108669 | A1* | 5/2005 | Shibuya ........................ 716/9 |
| 2005/0168731 | A1* | 8/2005 | Shibuya et al. .......... 356/237.4 |
| 2005/0172247 | A1* | 8/2005 | Papadopoulou et al. ....... 716/5 |
| 2005/0240839 | A1* | 10/2005 | Allen et al. ................. 714/724 |
| 2006/0150130 | A1* | 7/2006 | Allen et al. ..................... 716/5 |
| 2006/0238755 | A1* | 10/2006 | Shibuya et al. .......... 356/237.4 |
| 2006/0239536 | A1* | 10/2006 | Shibuya et al. ............. 382/149 |

OTHER PUBLICATIONS

Papadopoulou, E. et al., "Critical Area Computation via Voronoi Diagrams," IEEE Transactions on Computer-Aided Design, vol. 18, No.4, Apr. 1999, pp. 463-474.

(Continued)

*Primary Examiner*—Phallaka Kik
(74) *Attorney, Agent, or Firm*—Richard M. Kotulak; Hoffman, Warnick & D'Alessandro LLC

(57) ABSTRACT

Method, system and program product for determining a critical area in a region of an integrated circuit layout using Voronoi diagrams and shape biasing. The method includes the steps of generating a biased Voronoi diagram based on a layout geometry of the region and incorporating a shape bias; and determining the critical area for the region using the biased Voronoi diagram.

20 Claims, 19 Drawing Sheets

OTHER PUBLICATIONS

Papadopoulou, E. et al., "The L∞ Voronoi Diagram of Segments and VLSI Applications," International Journal of Computational Geometry & Applications, vol. 11, No. 5, 2001, pp. 503-528.

Papadopoulou, E., "Critical Area Computation for Missing Material Defects in VLSI Circuits," IEEE Transactions on Computer-Aided Design of Integrated Circuits and Systems, vol. 20, No. 5, May 2001, pp. 583-597.

* cited by examiner

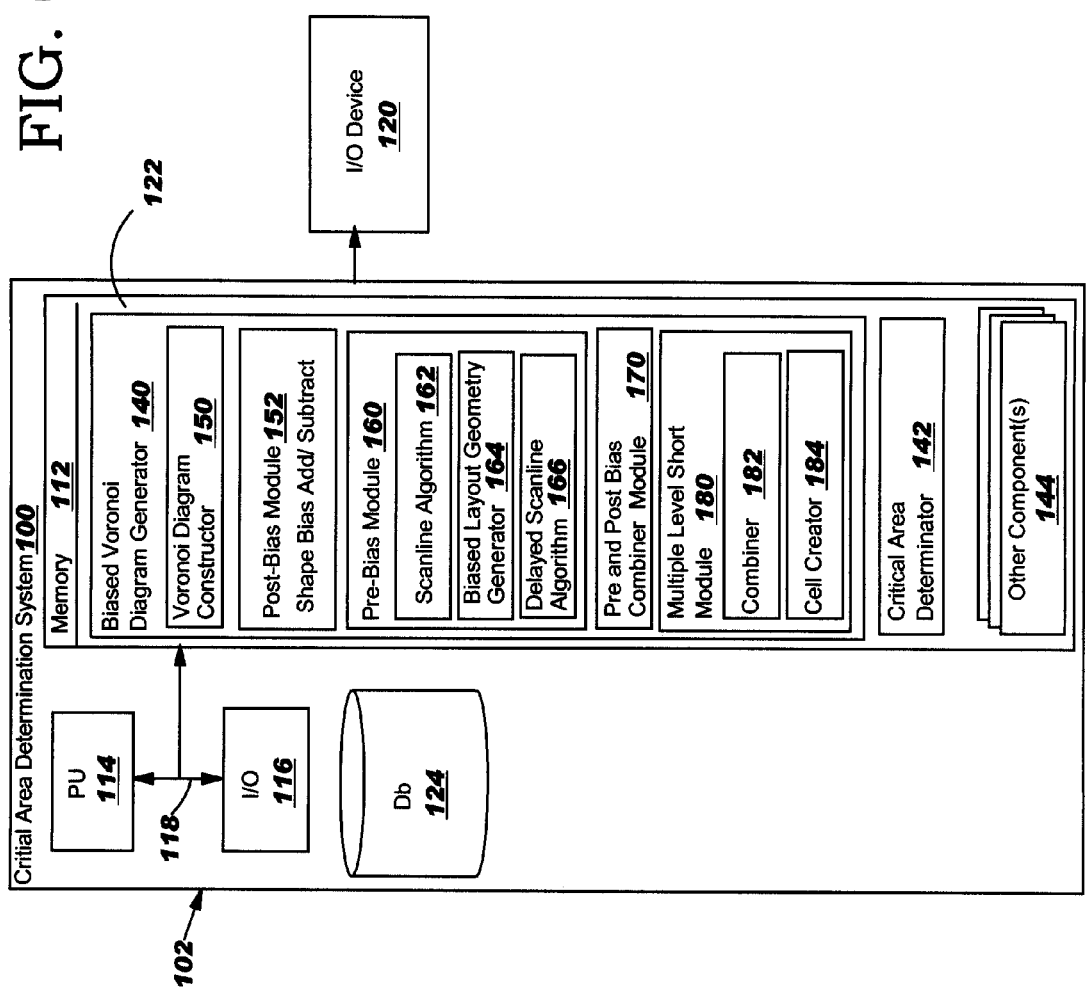

INTEGRATED CIRCUIT LAYOUT CRITICAL AREA DETERMINATION USING VORONOI DIAGRAMS AND SHAPE BIASING

BACKGROUND OF THE INVENTION

1. Technical Field

The present invention relates generally to integrated circuit design, and more particularly, to determining the critical area of an integrated circuit layout using Voronoi diagrams and shape biasing.

2. Related Art

The "critical area" of a very large scale integrated (VLSI) circuit layout is a measure that reflects the sensitivity of the layout to defects occurring during the manufacturing process. Critical area is widely used to predict the yield of a VLSI chip. Yield prediction is essential in today's VLSI manufacturing due to the growing need to control cost. Models for yield estimation are based on the concept of critical area which represents the main computational problem in the analysis of yield loss due to spot defects during fabrication. Spot defects are caused by particles such as dust and other contaminants in materials and equipment and are classified into two types: First, "extra material" defects cause shorts between different conducting regions by causing shapes to print slightly larger. Second, "missing material" defects create open circuits by causing shapes to print slightly smaller. Extra material defects are the ones that appear most frequently in a typical manufacturing process and are the main reason for yield loss. The difference in size between what is printed and what was intended to print is referred to as "shape bias," and may result in an enlargement or a shrinkage of the intended printed shapes.

The two most important methods for determining critical area are a Monte Carlo approach and a Voronoi approach. Several other methods to compute critical area have been proposed, but they generally involve long processing time. In the Monte Carlo approach, critical area is approximated by randomly simulating defects on the actual layout having varying sizes. Shape bias is modeled by applying a preprocessing step to expand or shrink all shapes in a level. Processing is then performed on the level. One problem with the Monte Carlo approach, however, is that it is extremely time and resource consuming. In particular, where shape biasing is implemented, the preprocessing step is very expensive and wasteful, particularly where not all shapes are used in the analysis. The Voronoi approach constructs Voronoi diagrams based on the layout geometry, which can be used to compute an exact critical area rather than an approximation. The Voronoi approach is also preferred because it is significantly faster than the Monte Carlo approach, i.e., it operates based on O(N log N). A sampling and/or statistical technique can be implemented with the Voronoi approach, which may make it about 60 times faster than the Monte Carlo approach. However, shape biasing is not used with the Voronoi approach.

In view of the foregoing, there is a need in the art for shape biasing for critical area computation using a Voronoi approach.

SUMMARY OF THE INVENTION

The invention includes method, system and program product for determining a critical area in a region of an integrated circuit layout using Voronoi diagrams and shape biasing. The method includes the steps of generating a biased Voronoi diagram based on a layout geometry of the region and incorporating a shape bias; and determining the critical area for the region using the biased Voronoi diagram.

A first aspect of the invention is directed to a method of determining critical area in a region of an integrated circuit design, the method comprising the steps of: generating a biased Voronoi diagram based on a layout geometry of the region and incorporating a shape bias; and determining the critical area for the region using the biased Voronoi diagram.

A second aspect of the invention includes a system for determining critical area in a region of an integrated circuit design, the system comprising: means for generating a biased Voronoi diagram based on a layout geometry of the region and incorporating a shape bias; and means for determining the critical area for the region using the biased Voronoi diagram.

A third aspect of the invention related to a computer program product comprising a computer useable medium having computer readable program code embodied therein for determining critical area in a region of an integrated circuit design, the program product comprising: program code configured to generate a biased Voronoi diagram based on a layout geometry of the region and incorporating a shape bias; and program code configured to determine the critical area for the region using the biased Voronoi diagram.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIG. 6 shows a block diagram of a critical area determination system according to the invention.

DETAILED DESCRIPTION

The description includes the following headings for organizational purposes only: I. Overview of Voronoi Diagrams, II. System Overview, III. Operational Methodology, A. Post-Biasing Embodiment, B. Pre-Biasing Embodiment, C. Combined Pre and Post-Biasing Embodiment, D. Pre-Biasing Embodiment for Multiple Levels for Shorts; and IV. Conclusion.

I. Overview of Voronoi Diagrams

As noted above, the invention implements a biased Voronoi diagram to determine a critical area of an integrated circuit layout including shape biasing. A Voronoi diagram may take a variety of forms depending on the structure to which it is applied. In the simplest example, referring to FIG. 1, a "Voronoi diagram" 8 for a set of sites (points) 10a–10d includes all points that are closer to a corresponding site, e.g., 10a, than to any other site 10b–10d. The resulting Voronoi diagram 8 includes a collection of regions 12a–12d, called "Voronoi cells," that divide up the plane in which sites 10a–10d sit, i.e., the plane of the page. Each Voronoi cell 12a–12d is in the shape of a convex polygon (for point sites only) having edges that are bisectors of sites 10a–10d. Each Voronoi cell 12a–12d corresponds to, or is owned by, one of sites 10a–10d. Again, all points in one cell, e.g., 12a, are closer to the corresponding site 10a than to any other site 10b–10d.

Figure 2A:
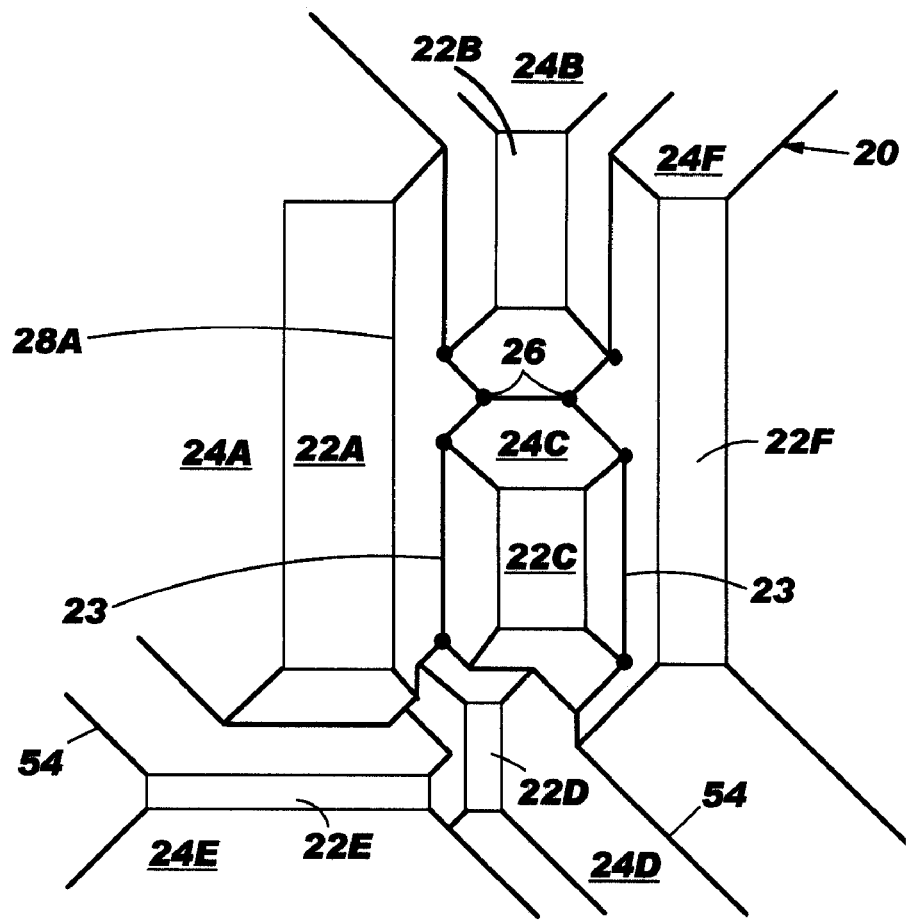
FIG. 2A shows an exterior Voronoi diagram for a set of polygons using the $L_\infty$ metric.
Figure 2B:
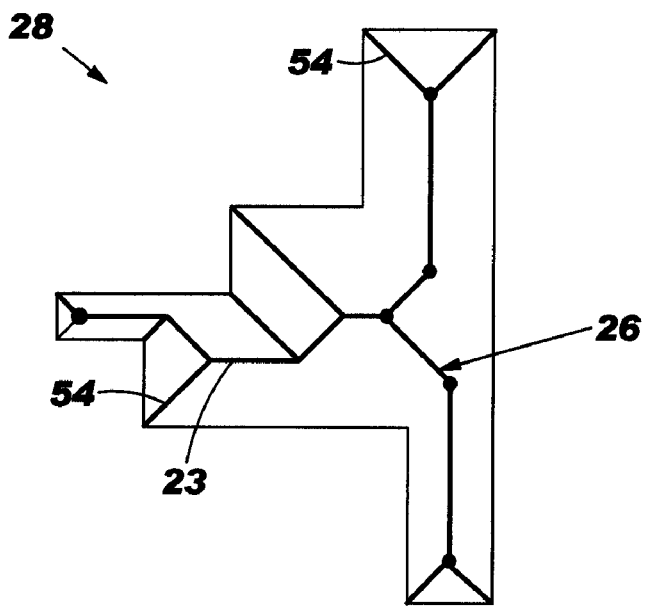
FIG. 2B shows an interior Voronoi diagram for a polygon using the $L_\infty$ metric.
Figure 3A:
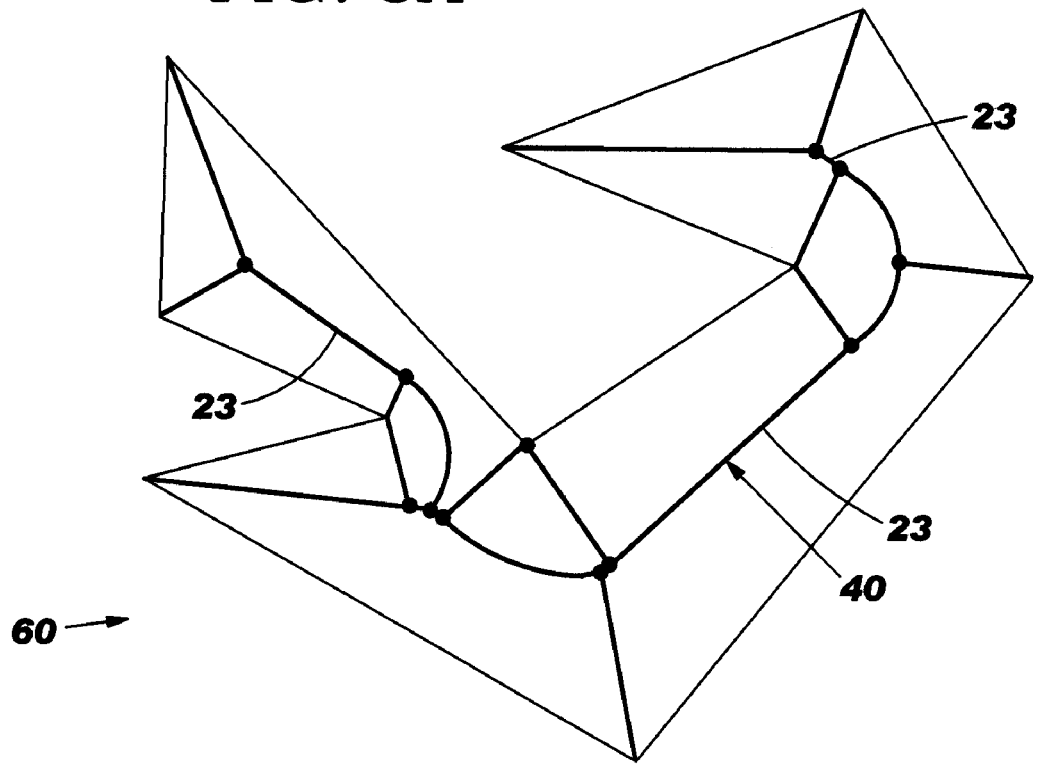
FIG. 3A shows an interior Voronoi diagram for an acute polygon using the Euclidean metric.
Figure 3B:
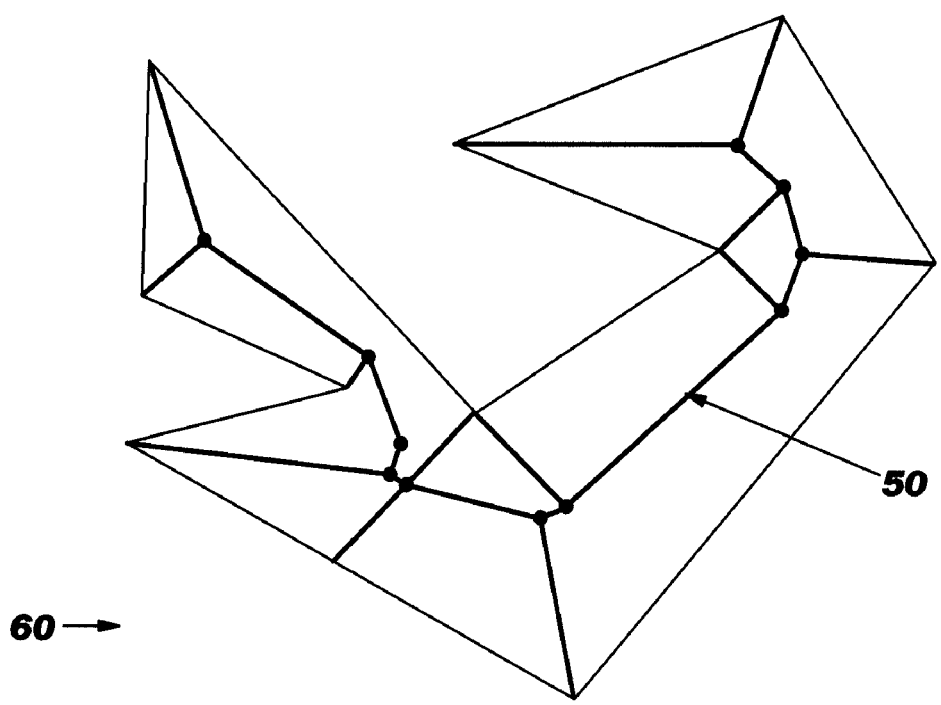
FIG. 3B shows an interior Voronoi diagram for the acute polygon of FIG. 3 using the $L_\infty$ metric.

FIGS. 2A–2B illustrate an exterior Voronoi diagram 20 and an interior Voronoi diagram 26 for orthogonal shapes, respectively. FIG. 2A illustrates a set of disjointed polygonal sites 22A–22F, and FIG. 2B illustrates a polygon 28. FIGS. 3A–B illustrate interior Voronoi diagrams 40, 50 for an acute polygon shape 60. As used herein, the term "boundary" shall refer to an outer border or line of a shape, while an "edge" shall refer to a component of the boundary.

As shown in FIG. 2A, an external Voronoi diagram 20 for a set of disjoined polygonal sites, i.e., polygons 22A–22F, includes a partitioning of the plane containing polygons 22A–22F into Voronoi cells 24A–24F. Each Voronoi cell, e.g, 24A, for a polygon 22A includes a locus of points closer to polygon 22A than to any other polygon 22B–22F. That is, it includes bisectors 54 of adjacent polygons 22B–22F (others not shown). A Voronoi cell of a site s, e.g., polygon 22A, is denoted as reg(s) and polygon 22A is referred to as the owner of reg(s). A portion 23 of Voronoi diagram 20 that borders two Voronoi cells 24A and 24B is referred to as a "Voronoi edge," and includes portions of bisectors 54 between the owners of cells. A point 26 where three or more Voronoi edges 23 meet is called a "Voronoi vertex."

Referring to FIGS. 2B, 3A–3B, an interior Voronoi diagram 26, 40, 50 on an interior of a shape 60 (polygon 28 in FIG. 2B) is referred to as a "medial axis." Formally, the "medial axis" is the locus of points [q] internal to a polygon such that there are at least two points on the object's boundary that are equidistant from [q] and are closest to [q].

Figure 1:
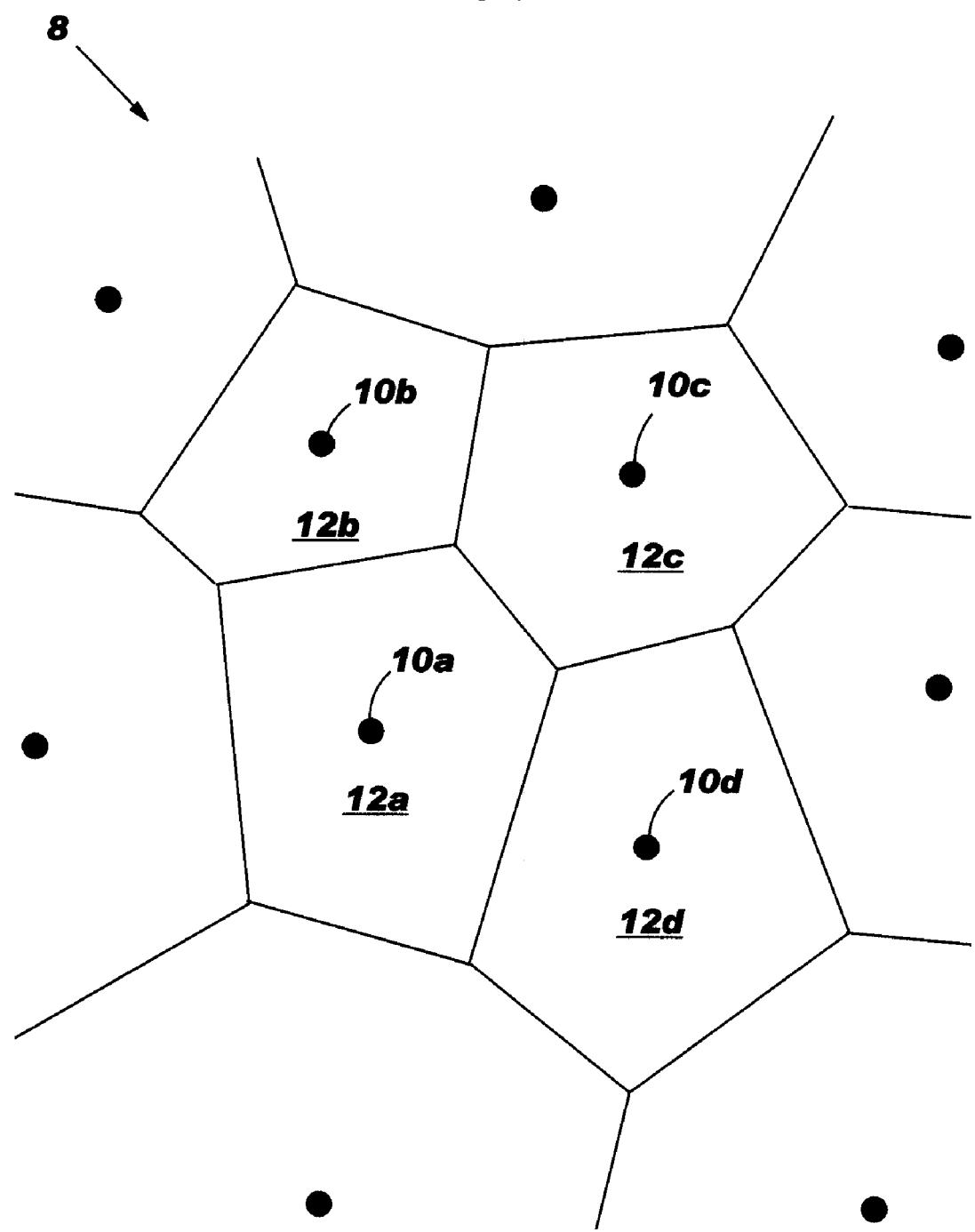
FIG. 1 shows a simplified example of a Voronoi diagram.
Figure 4A:
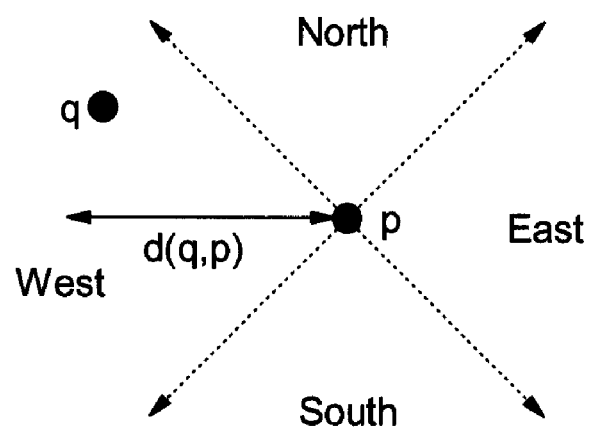
FIGS. 4A–4B show illustrations for description of the $L_\infty$ metric.
Figure 4B:
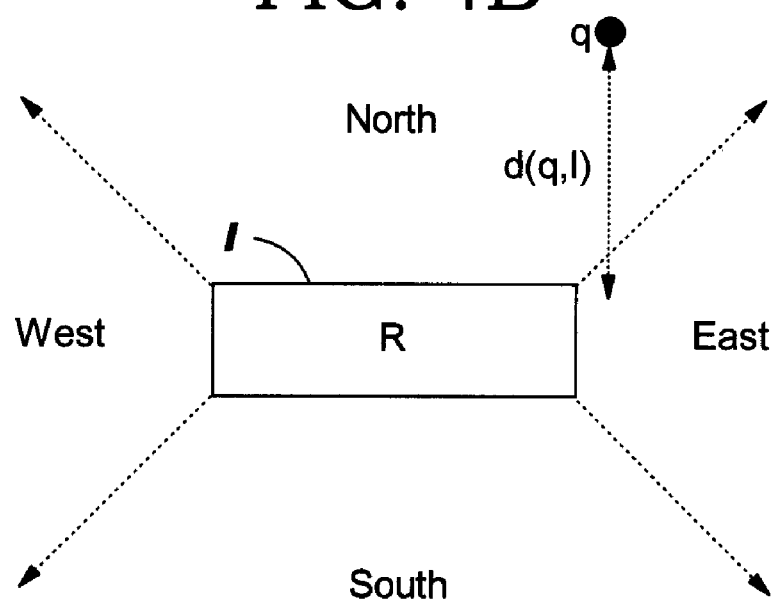

The above-described Voronoi diagrams of FIGS. 1 and 3A are illustrated as based on the Euclidean metric. That is, Voronoi distances are based on the Euclidean metric. The invention, as will be described further below, may also implement Voronoi diagrams based on an $L_\infty$ (L-infinity) metric. Referring to FIGS. 4A–4B, in the $L_\infty$ metric, the distance between two points (FIG. 4A) $p=(x_p, y_p)$ and $q=(x_q, y_q)$ is the maximum of the horizontal distance and the vertical distance between p and q, i.e., $d(p,q)=\max$ $[|x_p-x_q|,|y_p-y_q|]$.

Intuitively, the $L_\infty$ distance is the size of the smallest square touching p and q. The $L_\infty$ distance between any two points is less than or equal to the Euclidean distance between the points. Further, in the $L_\infty$ metric, the distance between a point p and a line l (FIG. 4B) is $d(p,l)=\min$ $[d(p,q), \forall q \in l]$.

The $L_\infty$ bisector of two polygonal elements (points or lines) is the locus of points at equal $L_\infty$ distance from the two elements.

Returning to FIG. 3B, medial axis 50 of shape 60 is illustrated as based on the $L_\infty$ metric. (Medial axis 28 in FIG. 2B is also based on the $L_\infty$ metric). As easily discerned by comparing FIGS. 3A–3B, the use of the $L_\infty$ metric simplifies Voronoi diagram 50 of polygonal objects and makes it simpler to compute. The $L_\infty$ Voronoi diagrams are a "skeleton" of straight-line segments having linear combinational complexity. It should be recognized that the concepts and functioning of the invention are the same regardless of the metric used, and the invention should not be limited to any particular metric.

Each point, including vertices, on a Voronoi diagram includes a "weight" representing its distance to a shape. Hence, the weight indicates half of a critical defect size. Further explanation of Voronoi diagrams and their application to critical area determination can be found in U.S. Pat. Nos. 6,317,859 and 6,178,539, which are hereby incorporated by reference for all purposes. See also, E. Papadopoulou et al., "The $L_\infty$ Voronoi Diagram of Segments and VLSI Applications," International Journal of Computational Geometry and Applications, Vol. 11, No. 5, 2001, 503–528.

Figure 5A:
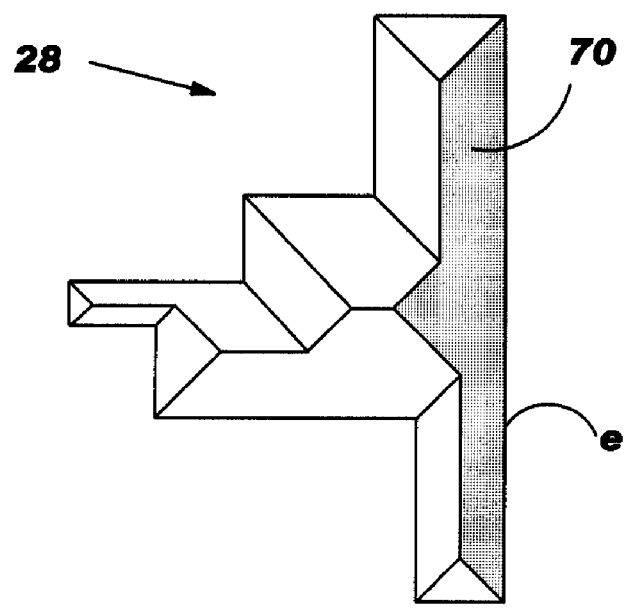
FIGS. 5A–5B show an illustrative second ($2^{nd}$) order Voronoi diagram.
Figure 5B:
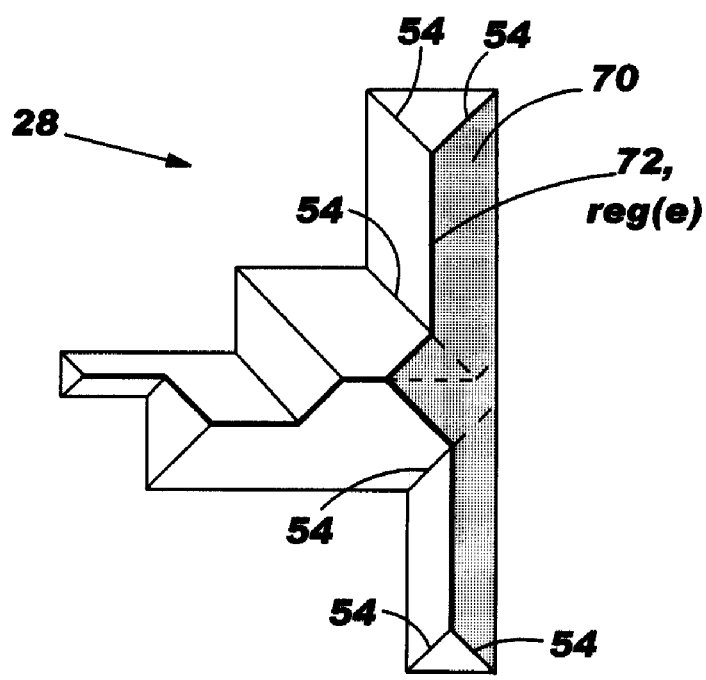

FIG. 5A shows an interior Voronoi cell 70 (also denoted reg(e) and shaded) of shape 28 (from FIG. 2B). FIG. 5B shows a second ($2^{nd}$) order Voronoi diagram 72 (dashed lines) of shape 28 within Voronoi cell 70 (also denoted reg(e) for edge e) that is the Voronoi diagram of shape 28 truncated within reg(e). The $2^{nd}$ order Voronoi diagram 72 within Voronoi cell 70 is generated by extending in Voronoi cell 70 all bisectors 54 incident to Voronoi cell 70 except those induced by an edge adjacent to e. The $2^{nd}$ order Voronoi diagram for opens within cell 70 is the $2^{nd}$ order Voronoi diagram of shape 28 within the cell excluding in addition to edge e the two edges of shape 28 neighboring edge e.

II. System Overview

With reference to the accompanying drawings, FIG. 6 is a block diagram of a critical area determination system 100 in accordance with the invention. System 100 is shown implemented on computer 102 as computer program code. To this extent, computer 102 is shown including a memory 112, a processing unit (PU) 114, an input/output (I/O) interface 116, and a bus 118. Further, computer 102 is shown in communication with an external I/O device/resource 120 and a storage system 122. In general, processing unit (PU) 114 executes computer program code, such as system 100, that is stored in memory 112 and/or storage system 124. While executing computer program code, processing unit (PU) 114 can read and/or write data to/from memory 112, storage system 124, and/or I/O device 120. Bus 118 provides a communication link between each of the components in computer 102, and I/O device 120 can comprise any device that enables user to interact with computer 102 (e.g., keyboard, pointing device, display, etc.).

Alternatively, a user can interact with another computing device (not shown) in communication with computer 102. In this case, I/O interface 116 can comprise any device that enables computer 102 to communicate with one or more other computing devices over a network (e.g., a network system, network adapter, I/O port, modem, etc.). The network can comprise any combination of various types of communications links. For example, the network can comprise addressable connections that may utilize any combination of wireline and/or wireless transmission methods. In this instance, the computing devices (e.g., computer 102) may utilize conventional network connectivity, such as Token Ring, Ethernet, WiFi or other conventional communications standards. Further, the network can comprise one or more of any type of network, including the Internet, a wide area network (WAN), a local area network (LAN), a virtual private network (VPN), etc. Where communications occur via the Internet, connectivity could be provided by conventional TCP/IP sockets-based protocol, and a computing device could utilize an Internet service provider to establish connectivity to the Internet.

Computer 102 is only representative of various possible combinations of hardware and software. For example, processing unit (PU) 114 may comprise a single processing unit, or be distributed across one or more processing units in one or more locations, e.g., on a client and server. Similarly, memory 112 and/or storage system 124 may reside at one or more physical locations. Memory 112 and/or storage system 124 can comprise any combination of various types of computer-readable media and/or transmission media including magnetic media, optical media, random access memory (RAM), read only memory (ROM), a data object, etc. I/O interface 116 can comprise any system for exchanging information with one or more I/O devices. Further, it is understood that one or more additional components (e.g., system software, math co-processing unit (PU), etc.) not shown in FIG. 6 can be included in computer 102. To this extent, computer 102 can comprise any type of computing device such as a network server, a desktop computer, a laptop, a handheld device, a mobile phone, a pager, a personal data assistant, etc. However, if computer 102 comprises a handheld device or the like, it is understood that one or more I/O devices (e.g., a display) and/or storage system 124 could be contained within computer 102, not externally as shown.

As discussed further below, system 100 is shown including a biased Voronoi diagram generator 140, a critical area determinator 142 and other system components 144. Biased Voronoi diagram generator (hereinafter "BVD generator") includes: a Voronoi diagram constructor 150; a post-bias module 152; a pre-bias module 160 including a scanline algorithm 162, a biased layout geometry generator 164, and a delayed scanline algorithm 166; a pre and post-bias combiner module 170; and a multiple level short module 180 including a combiner 182 and a cell creator 184. Other system components 144 may include any other function necessary for operation of the invention, but not explicitly described herein. It should be recognized that the terms "constructing" and "generating" have been used for differentiating between components, they do not necessarily connote different functionality other than as described herein.

III. Operational Methodology

Turning to FIGS. 7–19, operational methodology of the invention will now be described.

Figure 7:
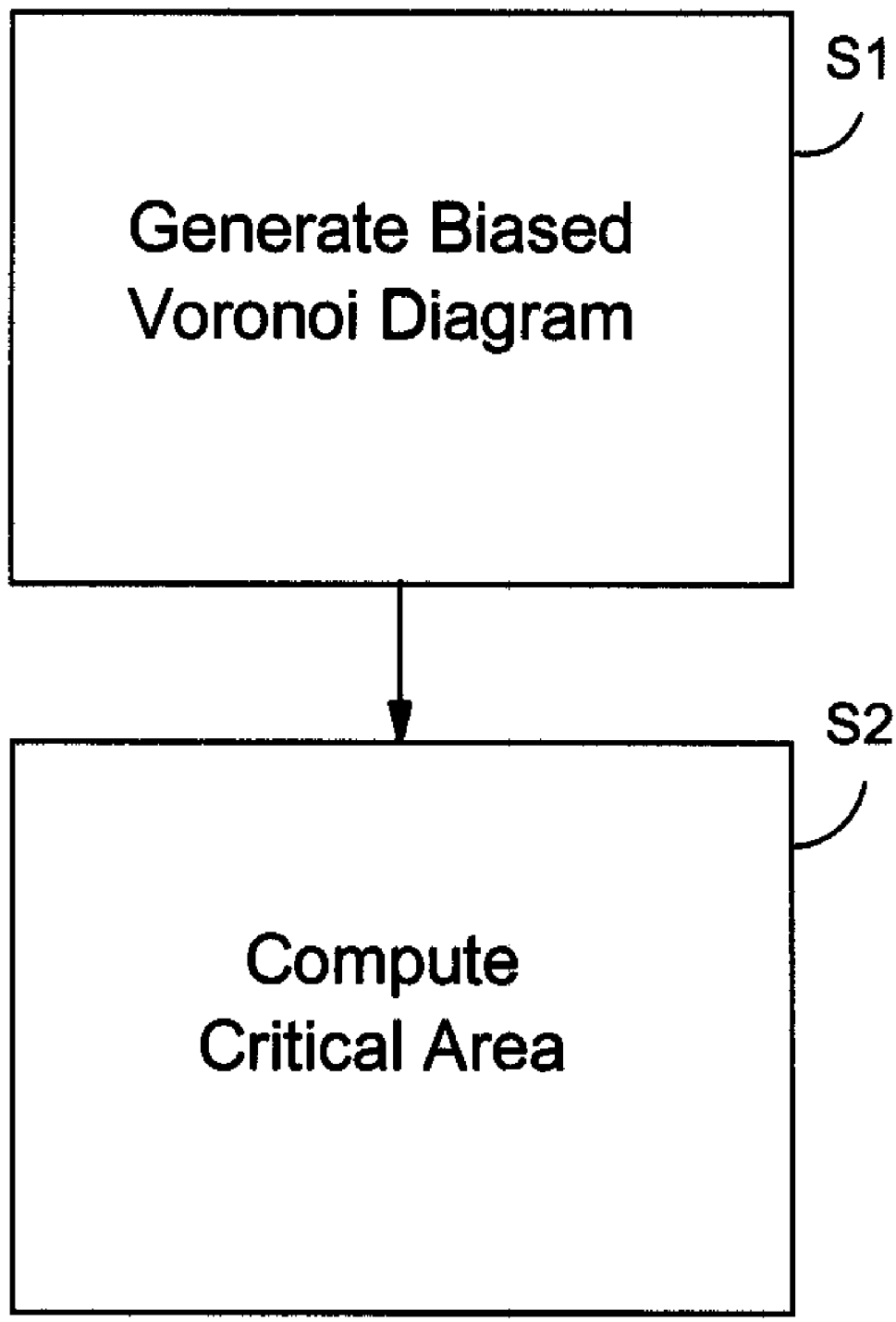
FIG. 7 shows a flow diagram of operation of the system of FIG. 6.

FIG. 7 shows a flow diagram of the overall methodology of determining critical area in a region of an integrated circuit design. In particular, in a first step S1, a biased Voronoi diagram is generated by BVD generator 140 based on a layout geometry of the region and incorporating a shape bias. A "biased Voronoi diagram" as used herein means a Voronoi diagram, as described above, having a shape bias incorporated therein. There are a number of different embodiments for conducting this step, which will be described below.

In a second step S2, the critical area is determined by critical area determinator 142 for the region using the biased Voronoi diagram. Critical area is determined in any now known or conventional fashion for calculating a critical area based on a Voronoi diagram. For example, U.S. Pat. Nos. 6,317,859 and 6,178,539 to Papadopoulou et al., previously incorporated by reference, disclose methods and systems for determining critical area using Voronoi diagrams. Accordingly, no further description of these techniques will be made here.

Turning to FIGS. 8–19, embodiments for generating a biased Voronoi diagram will now be described.

A. Post-Biasing Embodiment

Figure 8:
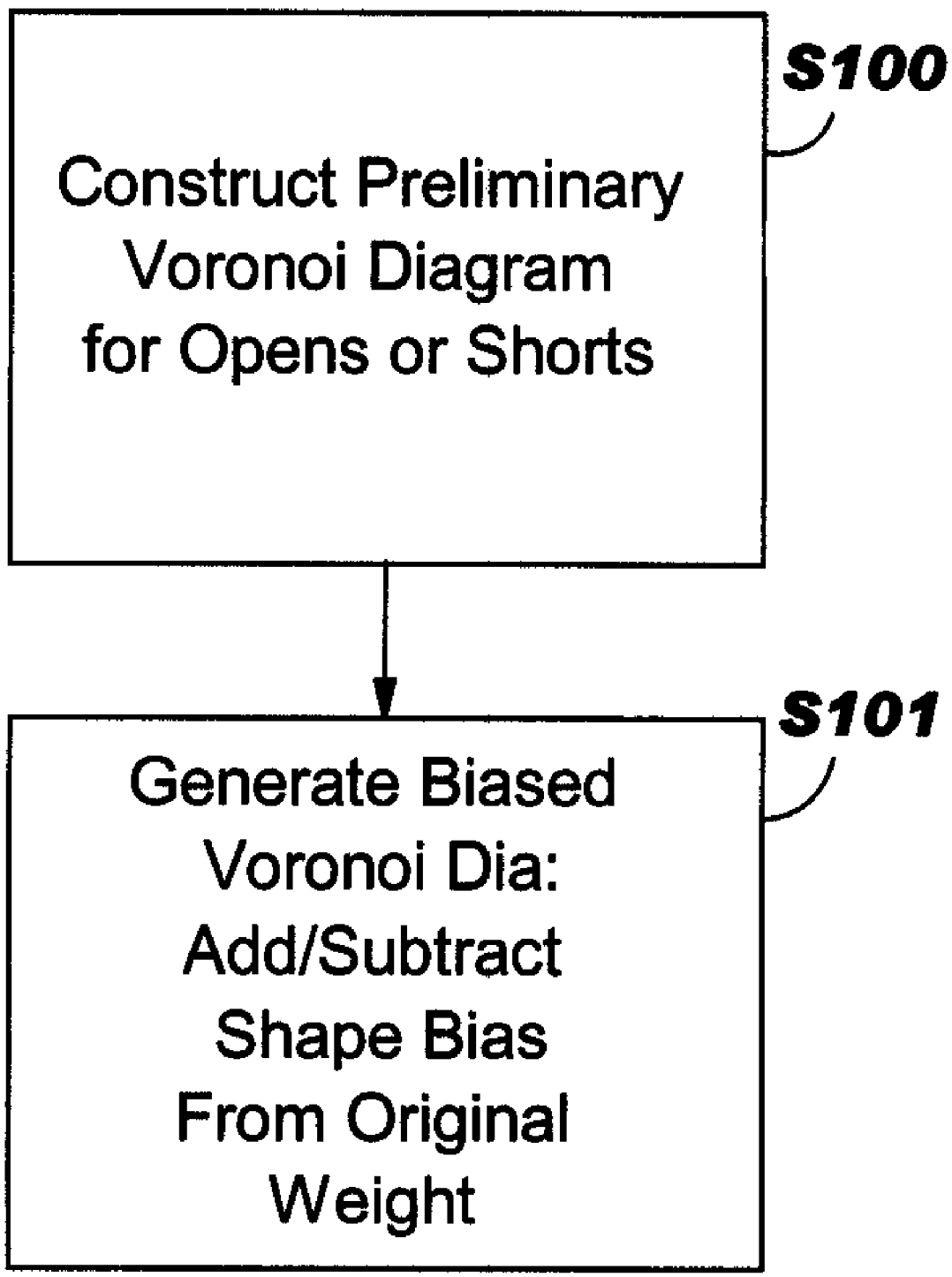
FIG. 8 shows a flow diagram of a first embodiment for generating a biased Voronoi diagram.

FIG. 8 illustrates a flow diagram of a first embodiment of a method for generating a biased Voronoi diagram, referred herein as a "post-biasing" because the shape bias is incorporated into the Voronoi diagram after the diagram is generated. This embodiment requires application of a shape bias uniformly across all of the layout geometry.

Figure 9:
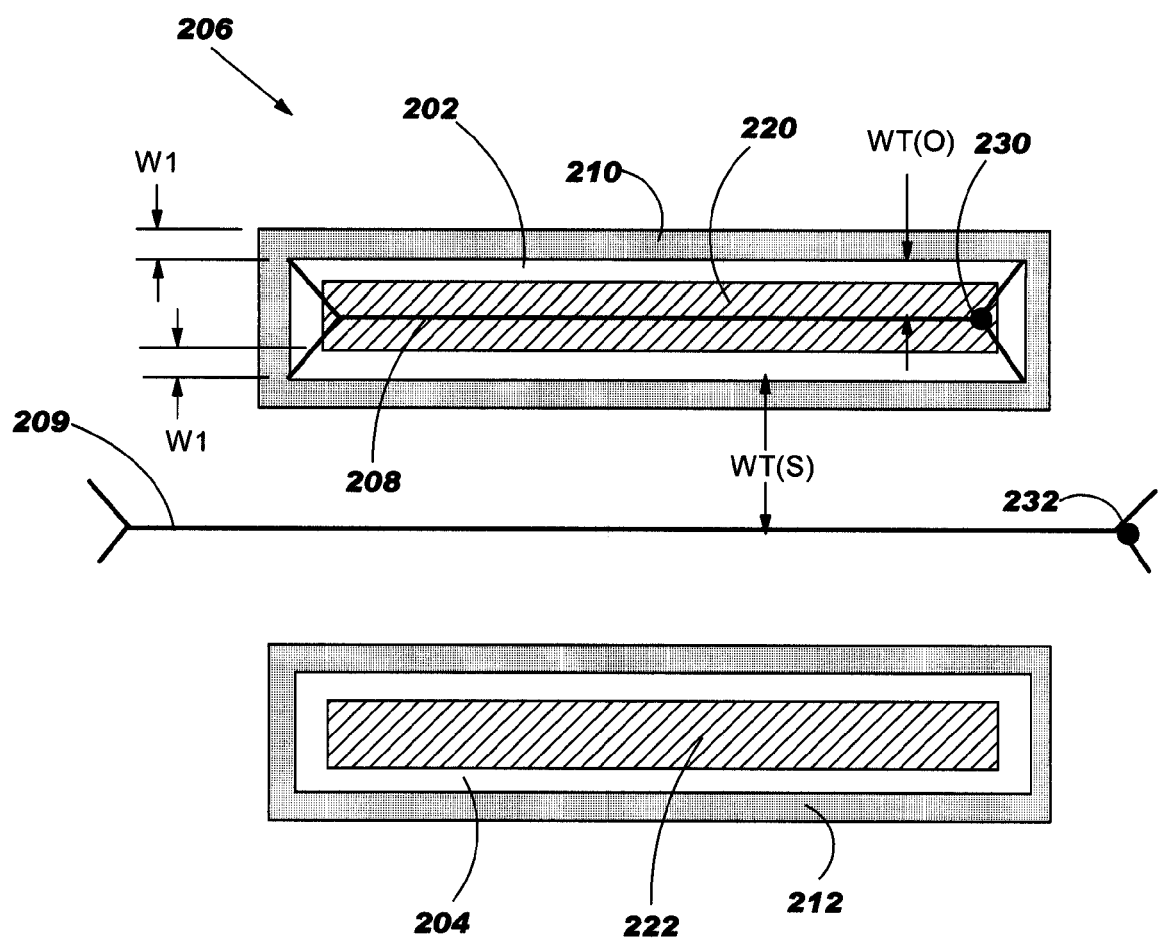
FIG. 9 shows an illustrative layout geometry for use with FIG. 8.

FIG. 9 shows an illustration of two shapes 202, 204 (white background) of a simplified layout geometry 206 for used in describing this embodiment. Shapes 210, 212 (shaded) show a shape bias W1 of shapes 202, 204 causing an enlargement, respectively; and shapes 220, 222 (diagonal cross-hatching) show shape bias W1 causing a shrinkage of shapes 202, 204, respectively.

In a first step S100, Voronoi diagram constructor 150 (FIG. 6) constructs a preliminary Voronoi diagram of layout geometry 206 for modeling opens or shorts. That is, a Voronoi diagram is generated for layout geometry 206 in a conventional fashion according to whether the spot defects to be modeled are opens or shorts. In the case that modeling is for shorts, an exterior Voronoi diagram 208 is generated having a weight WT(S) assigned to a vertex 230 that is equal to half the distance required for a short between shapes 202, 204. (Note, the weight of points within each Voronoi face is determined directly from the weights of the vertices. Accordingly, modifying the vertex weights in effect modifies the weight of all points in the diagram.) In the case that modeling is for opens, an interior Voronoi diagram 209 (only shown for shape 202) is generated having a weight WT(O) assigned to a vertex 232 that is equal to half the distance required for an open in shape 202. Note, shapes 202, 204 may not be the same shape or size and, accordingly, may have different original weights WT(O) for opens.

In a second step S101, a biased Voronoi diagram is generated by post-bias module 152 (FIG. 6) biasing preliminary Voronoi diagram 208 or 209. Note, a biased Voronoi diagram appears identical to preliminary Voronoi diagram 208 or 209, but the weights are changed. In the case that preliminary Voronoi diagram 208 models opens (i.e., it's an interior diagram), shape bias W1 is added to weight WT(O) of vertex 230 in preliminary Voronoi diagram 208 because a distance equal to twice the sum of the original weight and shape bias W1, i.e., 2 (original weight+W1), must be traversed in order to cause an open in shape 202. That is, a biased Voronoi diagram would have new weights=WT(O)+W1. In the case that preliminary Voronoi diagram 209 models shorts (i.e., it's an exterior diagram), shape bias W1 is subtracted from original weight WT(S) of vertex 232 in preliminary Voronoi diagram 209 because a distance equal to twice the difference between the original weight WT(S) and shape bias W1, i.e., 2 (original weight WT(S)−W1), must be traversed in order to cause a short between shapes 202, 204.

It should be understood that different shape bias values may occur for the different types of biases. For example, a shape bias W(X) may occur for enlargements and a shape bias W(Y) may occur for shrinkage, where X≠Y. If this occurs, the above-described embodiment may be repeated to accommodate each shape bias.

B. Pre-Biasing Embodiment

Figure 10:
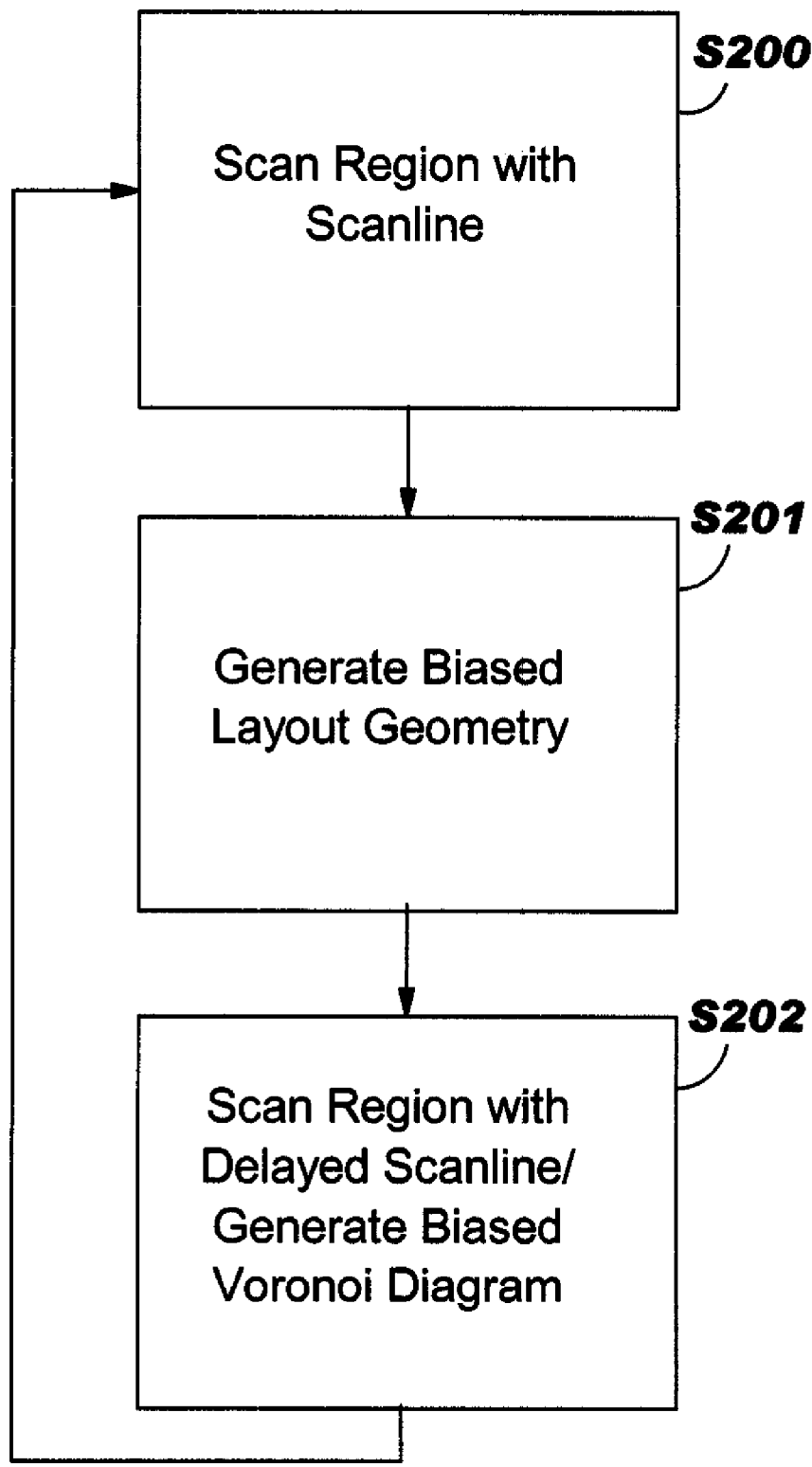
FIG. 10 shows a flow diagram of a second embodiment for generating a biased Voronoi diagram.
Figure 11:
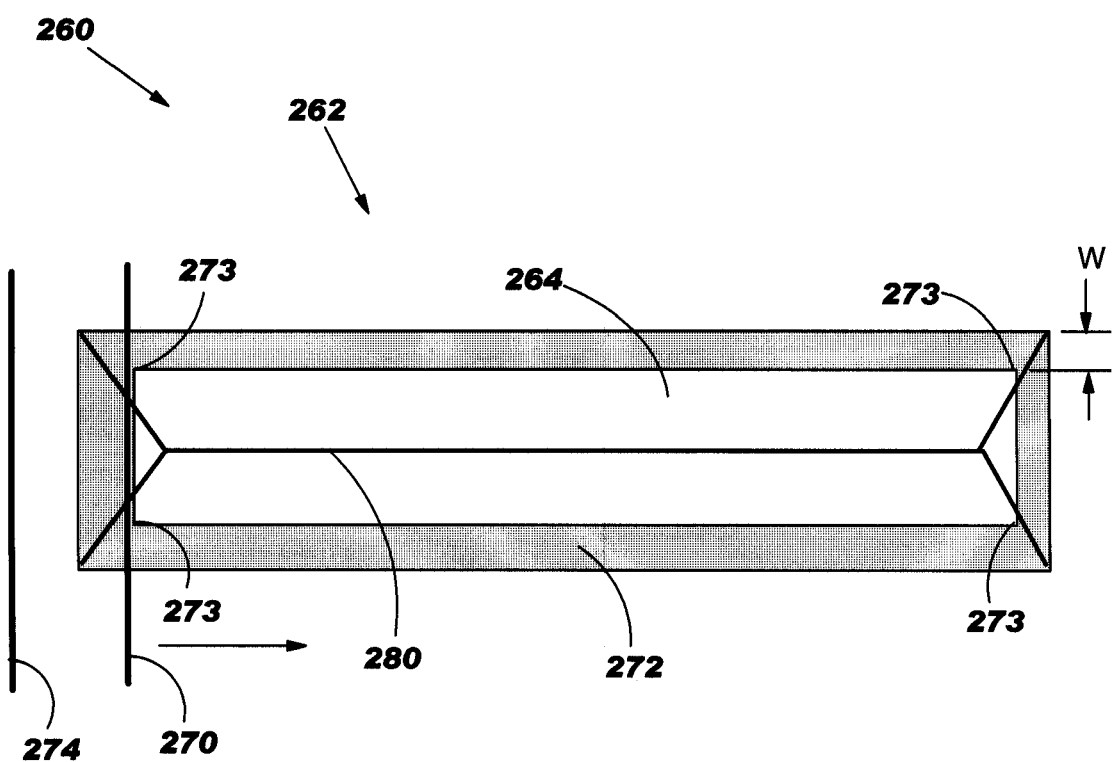
FIG. 11 shows an illustrative layout geometry for use with FIG. 10.

Referring to FIG. 10, a flow diagram of a second embodiment of a method for generating a biased Voronoi diagram is shown. This embodiment is referred to herein as "pre-biasing" because the shape bias is incorporated in a design layout prior to construction of a biased Voronoi diagram. This embodiment is advantageous compared to the post-biasing embodiment, described above, because the post-biasing technique must be applied uniformly throughout a design layout. Unfortunately, defects do not necessarily occur uniformly throughout a design layout during manufacturing. For example, a defect may occur between levels of a design layout or different levels may be affected differently, e.g., one may shrink, while another enlarges. The pre-biasing embodiment can be applied to individual regions, e.g., shapes, areas, levels, etc., as will be described below. FIG. 11 shows a region 260 of a layout geometry 262 (greatly simplified that includes a shape 264 (white rectangle), which will be used to explain the second embodiment.

With reference to FIGS. 10 and 11, in a first step S200, region 260 of layout geometry 262 is scanned using a first scanline 270 by scanline algorithm 162 (FIG. 6) of pre-bias module 160 (FIG. 6). Scanline algorithm 162 may include any now known or later developed scanline algorithm. The result is data regarding the geographic layout of layout geometry 262.

In a next step S201, a biased layout geometry 272 is generated by biased layout geometry generator 164 (FIG. 6) by changing corners 273 in region 260 of layout geometry 262 by shape bias W. In other words, based on the data gathered in step S200, corners 273 in region 260 are changed to incorporate shape bias W, i.e., moved to shrink shapes or enlarge shapes (as shown) within region 260. Biased layout geometry 272 is temporarily stored (buffered). The minimum size of the buffer is the maximum distance perpendicular to the scanline that a shape can grow or shrink from its original location.

In a next step S202, biased layout geometry 270 is scanned with a delayed (second) scanline 274 to incorporate shape bias W, and biased Voronoi diagram 280 is generated by Voronoi diagram constructor 150 (FIG. 6) based on the scanning by delayed scanline algorithm 166 (FIG. 6). As a result of scanning using delayed scanline 274, biased Voronoi diagram 280 is generated based on biased layout geometry 272 and, accordingly, has weighting that corresponds to biased layout geometry 272 and includes shape bias W.

It should be understood that while region 260 and layout geometry 262 are shown including a single shape 264, an actual layout geometry would include many more shapes and corners 273. In this case, corners 273 within biased layout geometry 272 must be sorted in scanline order to avoid problems, for example, as required by Voronoi diagram constructor 150.

The above-described pre-biasing embodiment may be applied to a plurality of regions 260 within a particular level of layout geometry 262. In this case, each region 260 may have a shape bias W particular to that region. Generating of biased Voronoi diagram (steps S200–S202) would be repeated for each region using the particular shape bias therefor. In this fashion, the pre-biasing embodiment has a wider application than the post-biasing embodiment since it can be applied on a region-by-region basis.

C. Combined Pre and Post-Biasing Embodiment

As noted above, different multiple regions may experience different shape biases. One type of multiple regions setting that may require special handling is multiple level fault mechanisms. One example multiple level fault mechanism in which different shape biases are observed is an "open with via blockage," which is a defect on a layout that causes a break in a wire or obstructs a via. In this case, the defect involves two levels of the layout so any critical area determination must address the level's different shape bias values.

Figure 12:
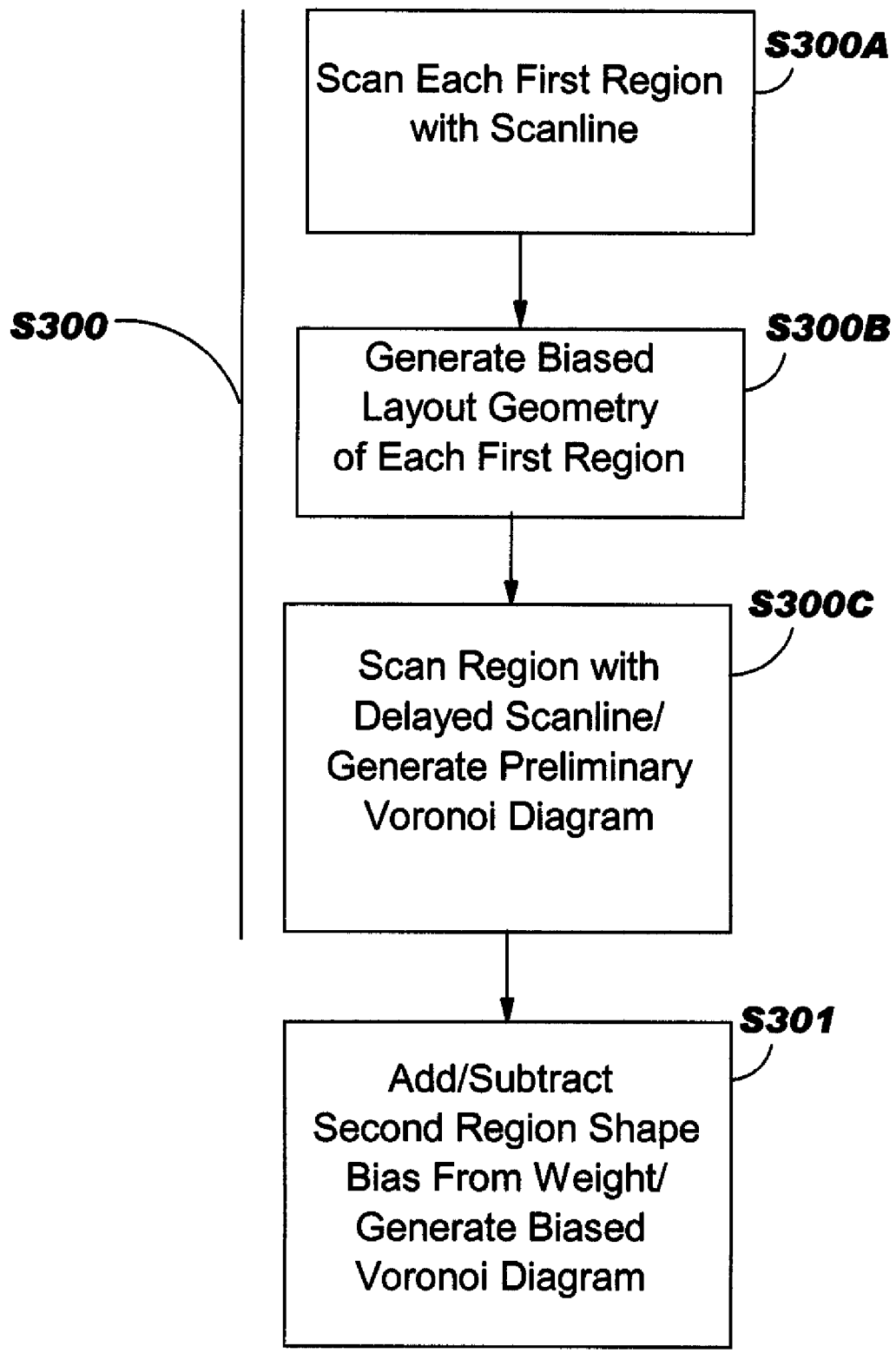
FIG. 12 shows a flow diagram of a third embodiment for generating a biased Voronoi diagram.
Figure 13:
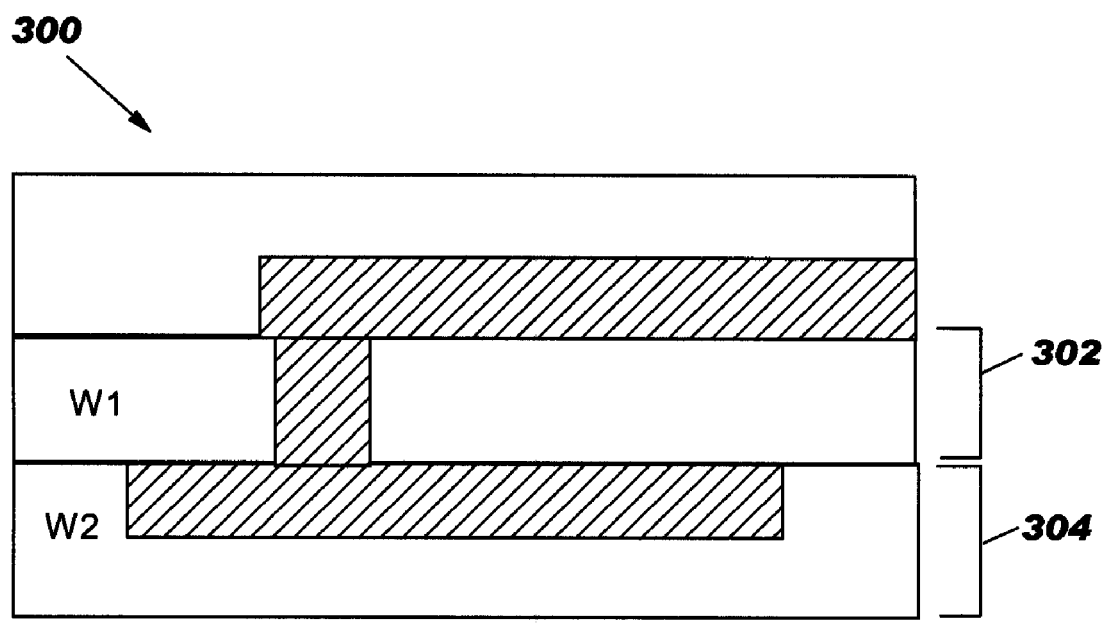
FIG. 13 shows an illustrative layout geometry for use with FIG. 12.

FIG. 12 shows a flow diagram for a third embodiment of the invention in which the above-described pre and post-biasing embodiments are combined to address this situation. FIG. 13 shows illustrative layout geometry 300 including two regions 302, 304, i.e., levels, for description of the process shown in FIG. 12. In this example, first region 302 is a via level having a first shape bias W1 and region 304 is a metal level having a second shape bias W2, where W1≠W2. It should be understood that any number of first regions 302 may be evaluated, as will be described below. Each first region 302 may or may not be disparate from each other first region 302, e.g., non-contiguous.

As an overview, pre and post-biasing combiner module 170 (FIG. 6) calls pre-biasing module 160 (FIG. 6) to apply a pre-bias to at least one first region (e.g., level) using a respective compensated first region shape bias for each first region, and then calls post-biasing module 152 to post-bias each first region and a second region (e.g., level) using a second region shape bias. (The defect type to be evaluated, i.e., open or short, must be the same for each region so that the pre and post-biasing are applied to the same type defect). Since the post-biasing steps must be applied uniformly across the layout, i.e., to all regions 302, 304, special precautions must be taken to attain application of a desired first region shape bias W1 specific to each first region 302. In particular, in order to achieve a specific first region shape bias W1 for each first region 302, a compensated first region shape bias WC must applied to each first region 302 during a first step of pre-biasing such that application of the post-biasing embodiment using a desired second region shape bias W2 for second region 304 on all regions 302, 304 will result in the specific first region shape bias W1 for each first region 302. Each compensated first region shape bias WC for each first region is equivalent to the desired first region shape bias W1 for a respective first region 302 minus second shape bias W2, i.e., WC=W1−W2.

Turning to FIG. 12, in a first step S300, pre-biasing each first region 302 using compensated first region shape bias WC specific to each first region 302 is conducted, as described relative to FIGS. 10–11. In a first sub-step S300A, each first region 302 of layout geometry 300 is scanned by scanline algorithm 162 (FIG. 6) using a first scanline (not shown). In a next sub-step S300B, a biased layout geometry (not shown) is generating by biased layout geometry generator 164 (FIG. 6) changing corners in each first region 302 of layout geometry 300 by compensated first region shape bias WC specific to each first region. In a third sub-step S300C, a preliminary Voronoi diagram is constructed by Voronoi diagram constructor 150 by scanning the biased layout geometry with a second scanline (not shown) using delayed scanline algorithm 166 to incorporate each compensated first region shape bias WC. As noted above, the preliminary Voronoi diagram is generated to model either opens or shorts, depending on the type of defects being analyzed in the critical area determination.

In a second step S301, the biased Voronoi diagram is constructed by post-biasing each first region 302 and second region 304 using second shape bias W2. In particular, post-bias module 152 adds second shape bias W2 to a weight of each vertex in the preliminary Voronoi diagram in the case that the preliminary Voronoi diagram models opens, and subtracts second shape bias W2 from the weight of each vertex in the preliminary Voronoi diagram in the case that the preliminary Voronoi diagram models shorts. As noted above, each compensated first region shape bias WC is equivalent to a desired first region shape bias W1 for first region 302 minus second shape bias W2, i.e., WC=W1−W2. As a result of the post-biasing step, second region shape bias W2 is applied to first region 302 such that second shape bias W2 is added to compensated shape bias WC, already applied, resulting in the desired first region shape bias W1 being applied to each first region 302, i.e., W1=WC+W2. Consequently, a desired first region shape bias W1 is applied to each first region 302 and second shape bias W2 is applied to second region 304.

D. Pre-Biasing Embodiment for Multiple Levels for Shorts

Multiple level fault mechanisms can also include multiple level shorts that occur within each level or between levels. In this regard, "multiple level shorts" may occur in a first level, within a second level or between the first level and second level. Conventionally, a critical area determination of this situation such as Monte Carlo would bias the shapes and then compute the union of the shapes. This approach, however, suffers from having to store the design in that form and revising the design layout.

Figure 14:
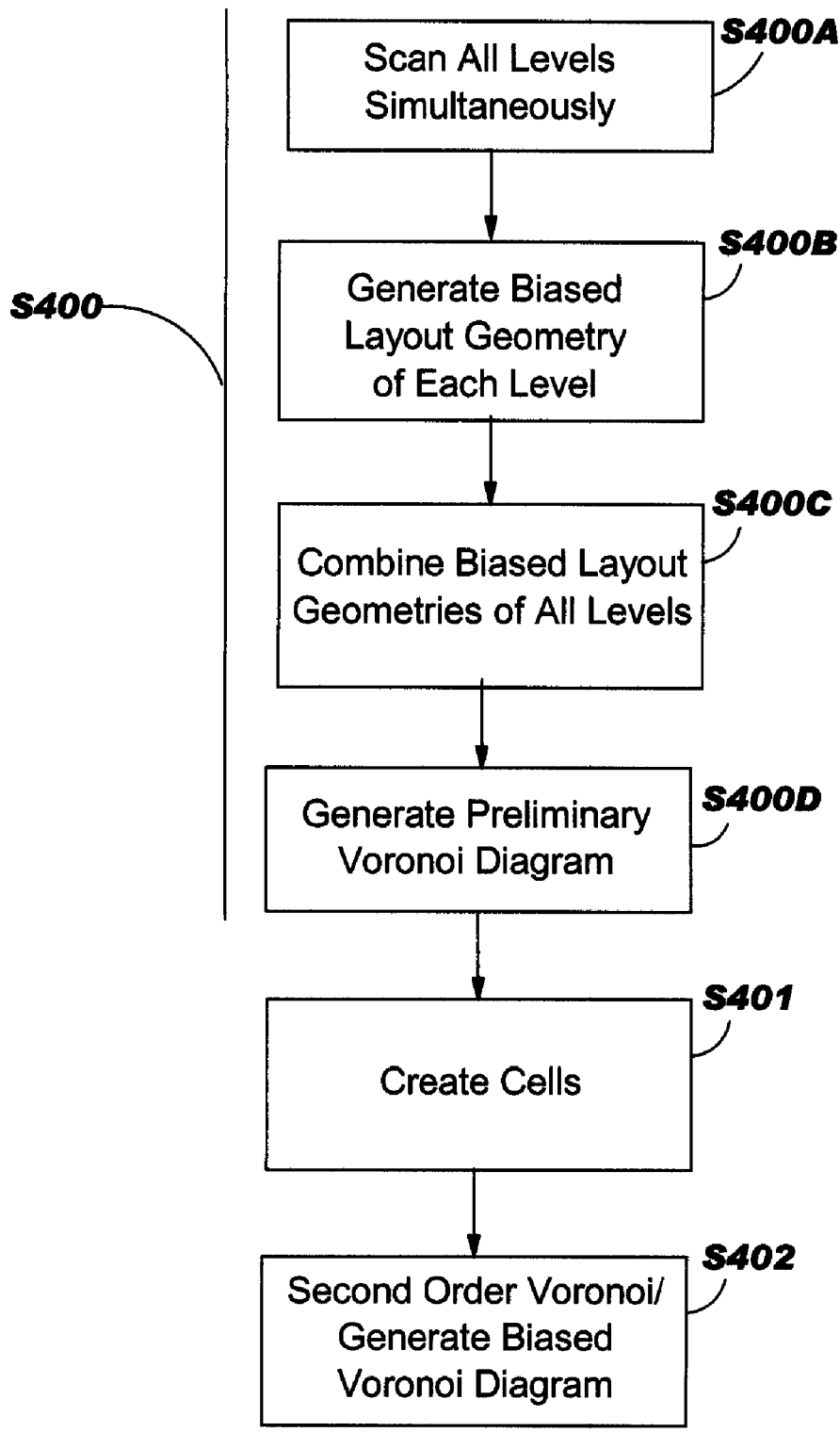
FIG. 14 shows a flow diagram of a fourth embodiment for generating a biased Voronoi diagram.
Figure 15:
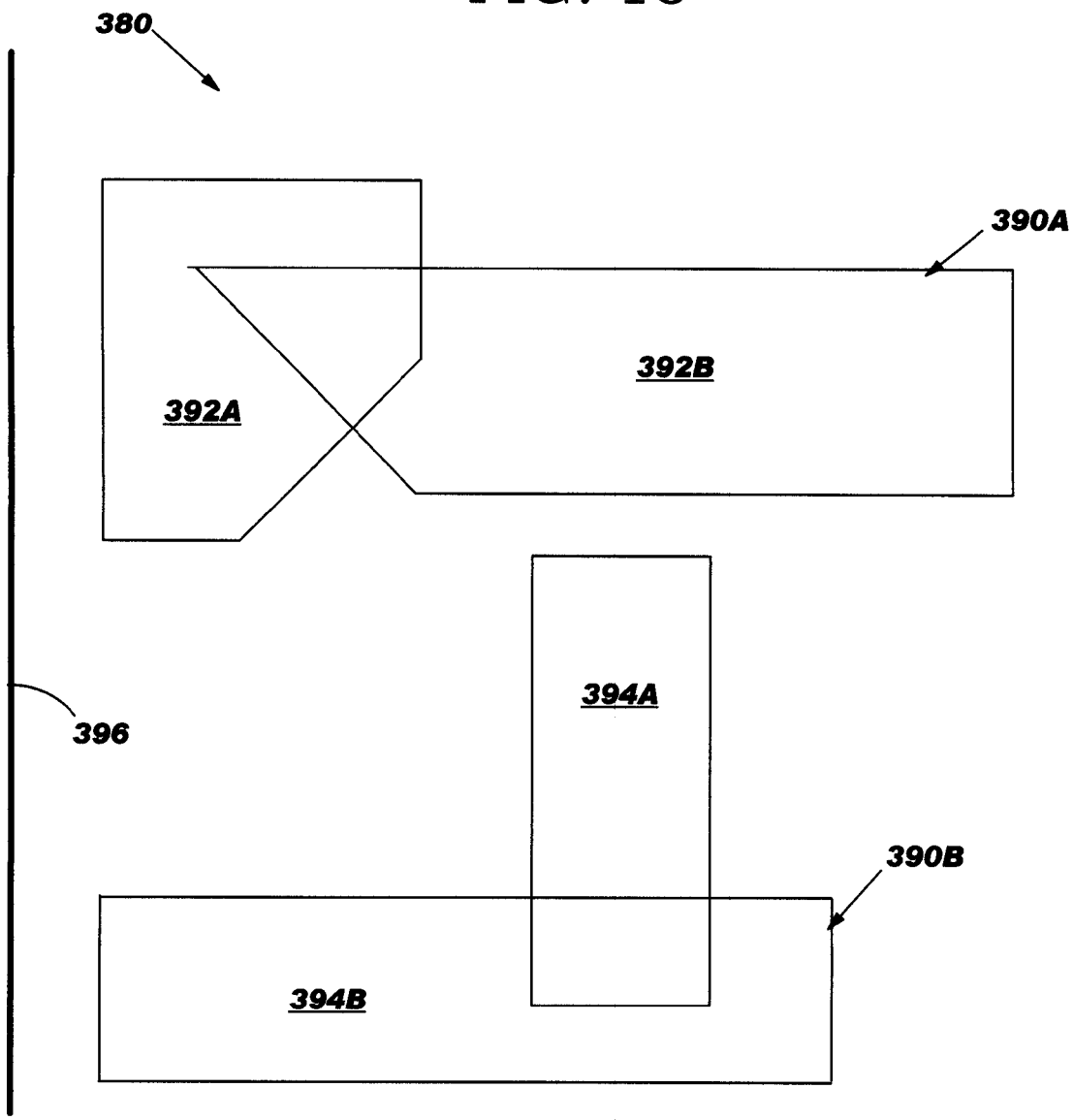
FIG. 15 shows an illustrative layout geometry for use with FIG. 14.

FIG. 14 shows a flow diagram of a fourth embodiment of the invention for generating a biased Voronoi diagram and that addresses the situation where the layout geometry includes a plurality of regions in the form of levels, and each level includes a level shape bias particular to that level. This embodiment is implemented by multiple level short module 180 (FIG. 6), as will be described below. FIG. 15 shows a multiple level IC design 380 including multiple levels 390A, 390B, each with two overlapping shapes 392A, 392B for level 390A and 394A, 394B for level 390B.

Figure 16:
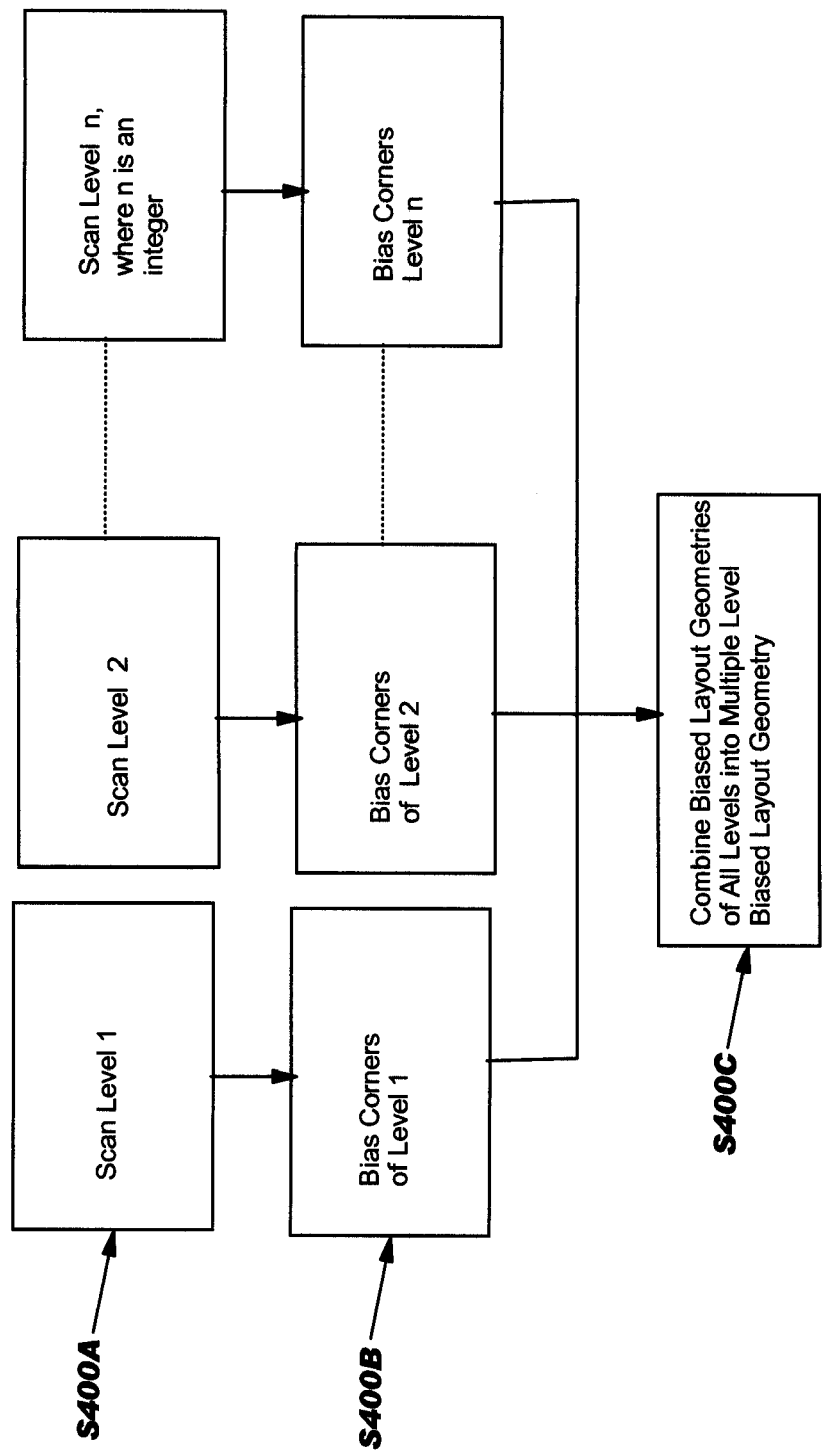
FIG. 16 shows a flow diagram of a detail of the fourth embodiment.

In a first step S400, shown in FIGS. 14 and 16, each level 390A, 390B is pre-biased by pre-biasing module 160. In particular, in a first sub-step S400A, all levels of the layout geometry 380 are scanned by scanline algorithm 162 (FIG. 6) (see scanline 396 in FIG. 15). In one embodiment, all levels are scanned simultaneously. In a next sub-step S400B, a biased layout geometry is generated by biased layout geometry generator 164 (FIG. 6) for each level by changing corners in each level 390A, 390B of the layout geometry by the shape bias particular to that level. The above two steps result in a biased layout geometry for each level of interest. As shown in FIG. 14 and 16, in step S400C, combiner 182 (FIG. 6) of multiple level short module 180 (FIG. 6) combines each of the biased layout geometries for all of the levels into a multi-level biased layout geometry.

Figure 17:
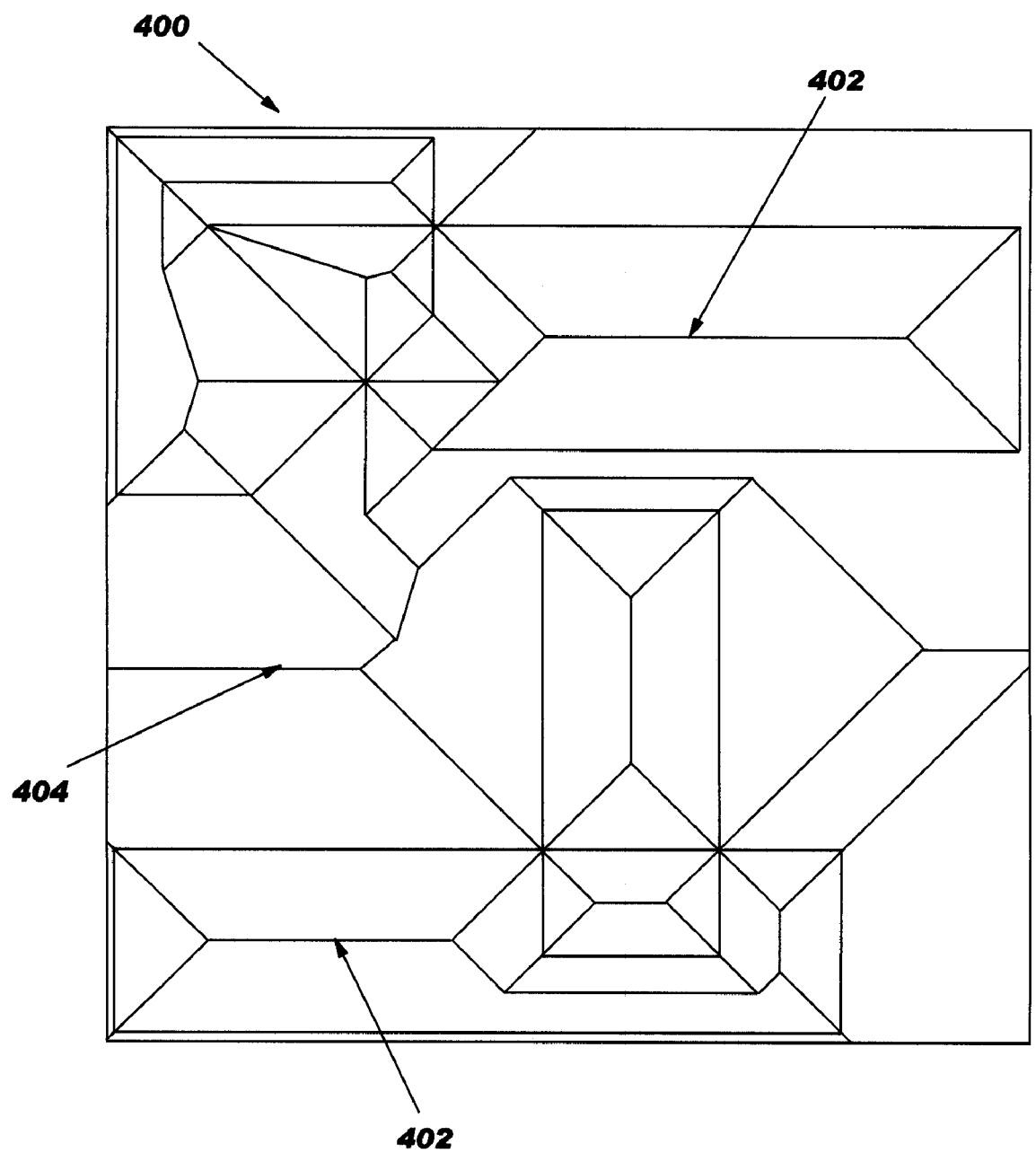
FIG. 17 shows the illustrative layout geometry of FIG. 15 including an interior and exterior Voronoi diagram.

Turning to FIGS. 14 and 17, in step S400D, a preliminary Voronoi diagram 400 is constructed by Voronoi diagram constructor 150 based on the multi-level biased layout geometry including an interior 402 and an exterior 404 Voronoi diagram for each shape within each level. This step naturally constructs a union of the shapes without having to actually union the shapes to themselves.

Figure 18:
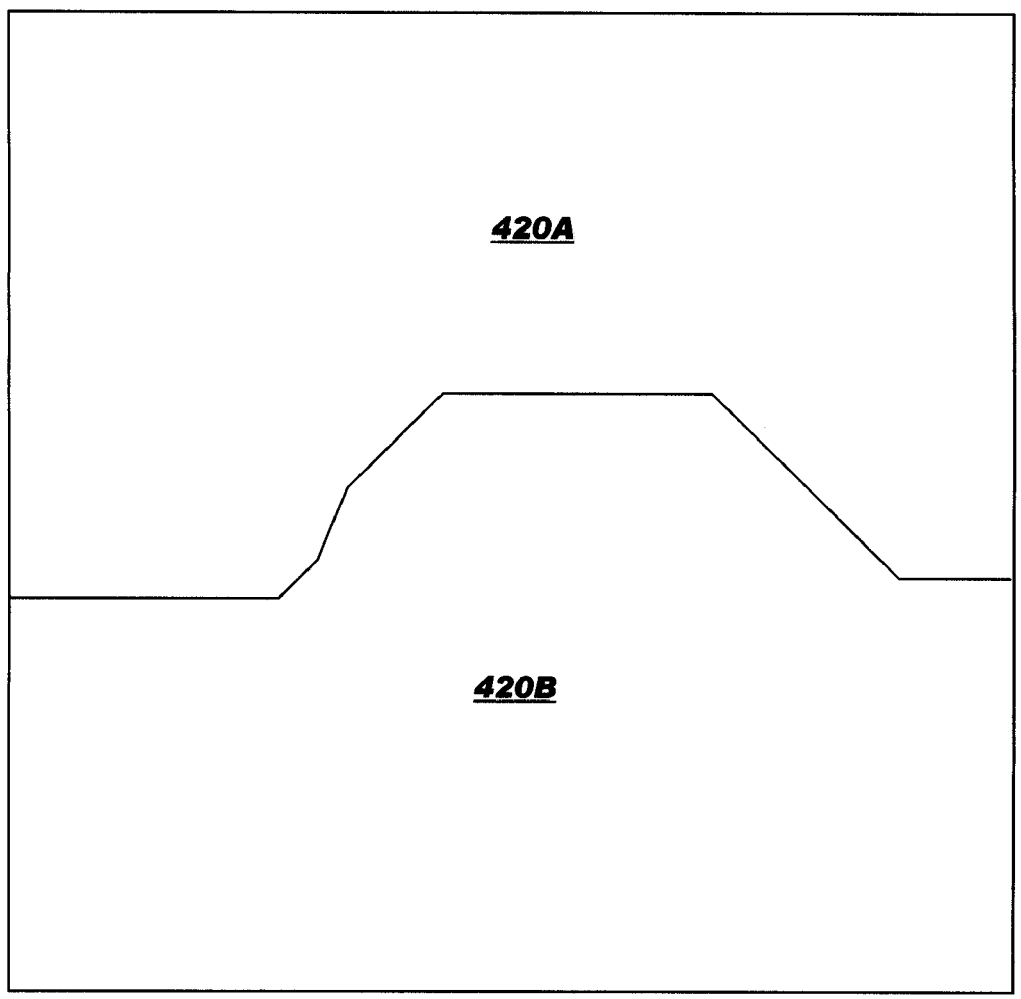
FIG. 18 shows the illustrative layout geometry of FIG. 17 broken into cells.

In step S401, as shown in FIG. 18, a cell 420A, 420B for each group of shape faces is created that belong to the same net by cell creator 184 (FIG. 6).

Figure 19:
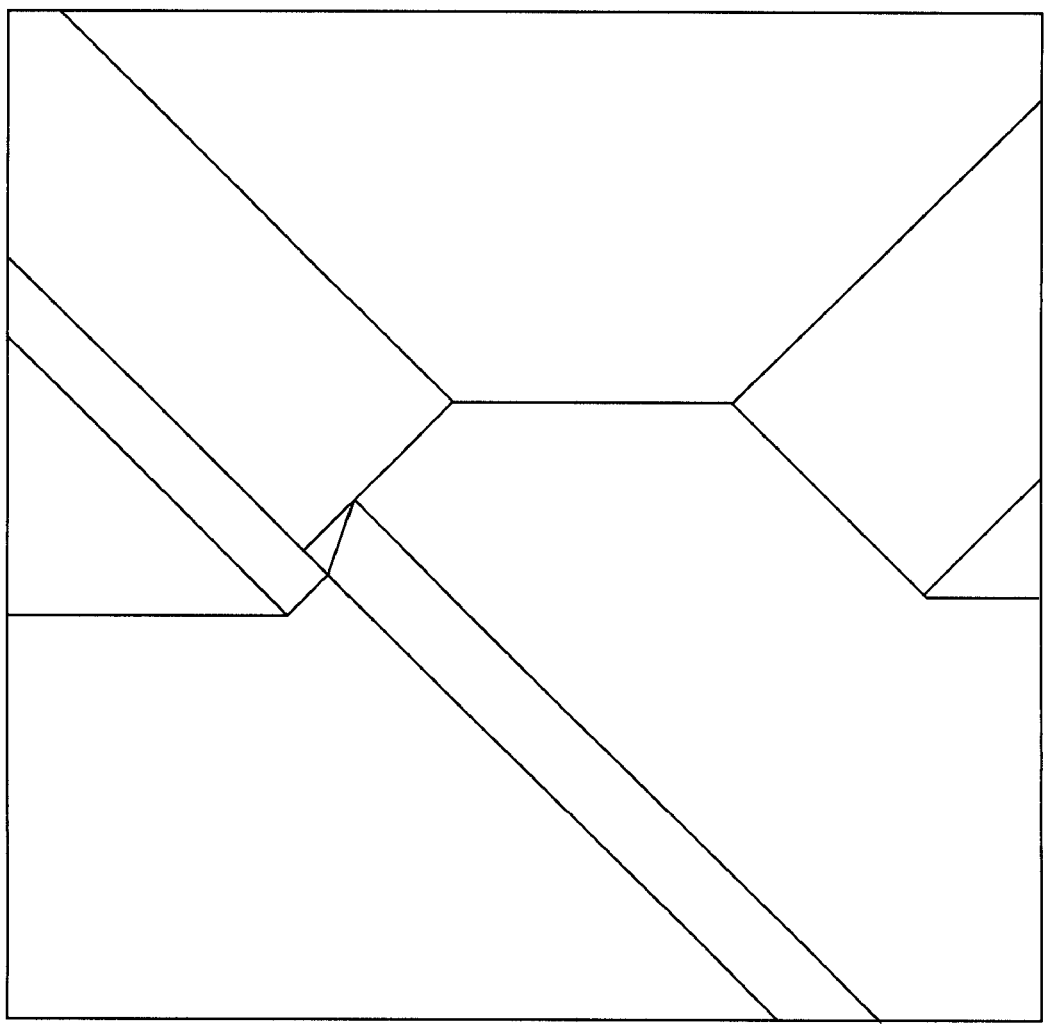
FIG. 19 shows a second order Voronoi diagram based on the cells of FIG. 18.

In step S402, as shown in FIG. 19, biased Voronoi diagram is generated in the form of a second ($2^{nd}$) order Voronoi diagram based on a boundary of each cell by Voronoi diagram constructor 150 (FIG. 6). A critical area can then be computed by critical area determinator 142 (FIG. 6) based on that $2^{nd}$ order Voronoi diagram.

IV. Conclusion

It is understood that the present invention can be realized in hardware, software, a propagated signal, or any combination thereof, and may be compartmentalized other than as shown. Any kind of computer/server system(s)—or other apparatus adapted for carrying out the methods described herein—is suitable. A typical combination of hardware and software could be a general purpose computer system with a computer program that, when loaded and executed, carries out the respective methods described herein. Alternatively, a specific use computer, containing specialized hardware for carrying out one or more of the functional tasks of the invention (e.g., system 100), could be utilized. The present invention also can be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form. Furthermore, it should be appreciated that the teachings of the present invention could be offered as a business method on a subscription or fee basis. For example, the system and/or computer could be created, maintained, supported and/or deployed by a service provider that offers the functions described herein for customers. That is, a service provider could offer the functionality described above.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of determining critical area in a region of an integrated circuit design, the method comprising:
   constructing a weighted, preliminary Voronoi diagram based on a layout geometry of the region;
   generating a biased Voronoi diagram from the preliminary Voronoi diagram and incorporating a shape bias to weights of the preliminary Voronoi diagram; and determining the critical area for the region using the biased Voronoi diagram.

2. The method of claim 1, wherein the region includes all of the layout geometry, and the generating includes:
constructing the preliminary Voronoi diagram of the layout geometry for modeling one of opens and shorts; and
constructing the biased Voronoi diagram by biasing the preliminary Voronoi diagram.

3. The method of claim 2, wherein the biased Voronoi diagram constructing includes conducting one of:
adding the shape bias to a weight of a vertex in the preliminary Voronoi diagram in a case that the preliminary Voronoi diagram models opens, and
subtracting the shape bias from the weight of a vertex in the preliminary Voronoi diagram in a case that the preliminary Voronoi diagram models shorts.

4. The method of claim 1, wherein the generating includes:
scanning the region of the layout geometry using a first scanline;
generating a biased layout geometry by changing corners in the region of the layout geometry by the shape bias; and
constructing the biased Voronoi diagram by scanning the biased layout geometry with a second scanline to incorporate the shape bias.

5. The method of claim 4, wherein the region includes a plurality of regions within a particular level of the layout geometry, each region having a shape bias particular to that region, wherein the biased Voronoi diagram generating step is repeated for each region using the particular shape bias therefor.

6. The method of claim 1, wherein the region includes a plurality of regions including at least one first region and a second region, and the generating includes:
a) pre-biasing each first region using a compensated first region shape bias specific to each region by:
1) scanning each first region of the layout geometry using a first scanline;
2) generating a biased layout geometry by changing corners in each first region of the layout geometry by the compensated first region shape bias specific to each first region; and
3) generating the preliminary Voronoi diagram by scanning each biased layout geometry with a second scanline to incorporate each compensated first region shape bias to model one of opens and shorts; and
b) constructing the biased Voronoi diagram by postbiasing each first region and the second region using a second shape bias by conducting one of:
adding the second shape bias to a weight of each vertex in the preliminary Voronoi diagram in a case that the preliminary Voronoi diagram models opens, and
subtracting the second shape bias from the weight of each vertex in the preliminary Voronoi diagram in a case that the preliminary Voronoi diagram models shorts, and
wherein each compensated first region shape bias is equivalent to a desired first region shape bias for a respective first region minus the second shape bias, and
wherein each first region is disparate from each other first region.

7. The method of claim 1, wherein the layout geometry includes a plurality of regions in a form of levels, each level including a level shape bias particular to that level, wherein the generating includes:
a) pre-biasing each level by:
1) scanning all levels of the layout geometry using a scanline;
2) generating a biased layout geometry for each level by changing corners in each level of the layout geometry by the shape bias particular to that level;
3) combining each of the biased layout geometries for all of the levels into a multi-level biased layout geometry; and
b) constructing the preliminary Voronoi diagram based on the multi-level biased layout geometry including an interior and an exterior Voronoi diagram for each shape within each level;
c) creating a cell for each group of shape faces that belong to a same net; and
d) constructing the biased Voronoi diagram in the form of a second order Voronoi diagram based on a boundary of each cell.

8. A system for determining critical area in a region of an integrated circuit design, the system comprising:
means for constructing a weighted, preliminary Voronoi diagram based on a layout geometry of the region;
means for generating a biased Voronoi diagram from the preliminary Voronoi diagram and incorporating a shape bias to weights of the preliminary Voronoi diagram; and
means for determining the critical area for the region using the biased Voronoi diagram.

9. The system of claim 8, wherein the region includes all of the layout geometry, and the generating means includes:
means for constructing the preliminary Voronoi diagram of the layout geometry for modeling one of opens and shorts; and
means for constructing the biased Voronoi diagram by biasing the preliminary Voronoi diagram.

10. The system of claim 9, wherein the biased Voronoi diagram constructing means includes means for conducting one of:
adding the shape bias to a weight of a vertex in the preliminary Voronoi diagram in a case that the preliminary Voronoi diagram models opens, and
subtracting the shape bias from the weight of a vertex in the preliminary Voronoi diagram in a case that the preliminary Voronoi diagram models shorts.

11. The system of claim 9, wherein the generating means includes:
means for scanning the region of the layout geometry using a first scanline;
means for generating a biased layout geometry by changing corners in the region of the layout geometry by the shape bias; and
means for constructing the biased Voronoi diagram by scanning the biased layout geometry with a second scanline to incorporate the shape bias.

12. The system of claim 11, wherein the region includes a plurality of regions within a particular level of the layout geometry, each region having a shape bias particular to that region, wherein the biased Voronoi diagram generating means repeats operation for each region using the particular shape bias therefor.

13. The system of claim 9, wherein the region includes a plurality of regions including at least one first region and a second region, and the generating means includes:
a) means for pre-biasing each first region using a compensated first region shape bias specific to each region by:
1) scanning each first region of the layout geometry using a first scanline;

2) generating a biased layout geometry by changing corners in each first region of the layout geometry by the compensated first region shape bias specific to each first region; and
3) generating the preliminary Voronoi diagram by scanning each biased layout geometry with a second scanline to incorporate each compensated first region shape bias to model one of opens and shorts; and b) means for constructing the biased Voronoi diagram by post-biasing each first region and the second region using a second shape bias by conducting one of:
adding the second shape bias to a weight of each vertex in the preliminary Voronoi diagram in a case that the preliminary Voronoi diagram models opens, and
subtracting the second shape bias from the weight of each vertex in the preliminary Voronoi diagram in a case that the preliminary Voronoi diagram models shorts, and
wherein each compensated first region shape bias is equivalent to a desired first region shape bias for a respective first region minus the second shape bias, and
wherein each first region is disparate from each other first region.

14. The system of claim 9, wherein the layout geometry includes a plurality of regions in a form of levels, each level including a level shape bias particular to that level, wherein the generating means includes:
a) means for pre-biasing each level by:
1) scanning all levels of the layout geometry using a scanline;
2) generating a biased layout geometry for each level by changing corners in each level of the layout geometry by the shape bias particular to that level;
3) combining each of the biased layout geometries for all of the levels into a multi-level biased layout geometry; and b) means for constructing the preliminary Voronoi diagram based on the multi-level biased layout geometry including an interior and an exterior Voronoi diagram for each shape within each level;
c) means for creating a cell for each group of shape faces that belong to a same net; and
d) means for constructing the biased Voronoi diagram in a form of a second order Voronoi diagram based on a boundary of each cell.

15. A computer program product comprising a computer useable medium having computer readable program code embodied therein for determining critical area in a region of an integrated circuit design, the program product comprising:
program code configured to construct a weighted, preliminary Voronoi diagram based on a layout geometry of the region;
program code configured to generate a biased Voronoi diagram from the preliminary Voronoi diagram and incorporating a shape bias to weights of the preliminary Voronoi diagram; and
program code configured to determine the critical area for the region using the biased Voronoi diagram.

16. The program product of claim 15, wherein the region includes all of the layout geometry, and the generating code includes:
program code configured to construct the preliminary Voronoi diagram of the layout geometry for modeling one of opens and shorts; and program code configured to construct the biased Voronoi diagram by biasing the preliminary Voronoi diagram by conducting one of:
adding the shape bias to a weight of a vertex in the preliminary Voronoi diagram in a case that the preliminary Voronoi diagram models opens, and
subtracting the shape bias from the weight of a vertex in the preliminary Voronoi diagram in a case that the preliminary Voronoi diagram models shorts.

17. The program product of claim 15, wherein the generating code includes:
program code configured to scan the region of the layout geometry using a first scanline;
program code configured to generate a biased layout geometry by changing corners in the region of the layout geometry by the shape bias; and
program code configured to construct the biased Voronoi diagram by scanning the biased layout geometry with a second scanline to incorporate the shape bias.

18. The program product of claim 17, wherein the region includes a plurality of regions within a particular level of the layout geometry, each region having a shape bias particular to that region, wherein the biased Voronoi diagram generating code repeats operation for each region using the particular shape bias therefor.

19. The program product of claim 15, wherein the region includes a plurality of regions including at least one first region and a second region, and the generating code includes:
a) program code configured to pre-bias each first region using a compensated first region shape bias specific to each region by:
1) scanning each first region of the layout geometry using a first scanline;
2) generating a biased layout geometry by changing corners in each first region of the layout geometry by the compensated first region shape bias specific to each first region; and
3) generating the preliminary Voronoi diagram by scanning each biased layout geometry with a second scanline to incorporate each compensated first region shape bias to model one of opens and shorts; and b) program code configured to construct the biased Voronoi diagram by post-biasing each first region and the second region using a second shape bias by conducting one of:
adding the second shape bias to a weight of each vertex in the preliminary Voronoi diagram in a case that the preliminary Voronoi diagram models opens, and
subtracting the second shape bias from the weight of each vertex in the preliminary Voronoi diagram in a case that the preliminary Voronoi diagram models shorts, and
wherein each compensated first region shape bias is equivalent to a desired first region shape bias for a respective first region minus the second shape bias, and
wherein each first region is disparate from each other first region.

20. The program product of claim 15, wherein the layout geometry includes a plurality of regions in a form of levels, each level including a level shape bias particular to that level, wherein the generating code includes:
a) program code configured to pre-bias each level by:
1) scanning all levels of the layout geometry using a scanline;

2) generating a biased layout geometry for each level by changing corners in each level of the layout geometry by the shape bias particular to that level;
3) combining each of the biased layout geometries for all of the levels into a multi-level biased layout geometry; and b) program code configured to construct the preliminary Voronoi diagram based on the multi-level biased layout geometry including an interior and an exterior Voronoi diagram for each shape within each level;

c) program code configured to create a cell for each group of shape faces that belong to a same net; and d) program code configured to construct the biased Voronoi diagram in the form of a second order Voronoi diagram based on a boundary of each cell.

* * * * *